United States Patent
Hung

(10) Patent No.: US 9,970,961 B2
(45) Date of Patent: May 15, 2018

(54) PROBE CARD FOR TESTING WAFERS WITH FINE PITCH CIRCUIT

(71) Applicant: Hermes-Epitek Corp., Taipei (TW)

(72) Inventor: Chien-Yao Hung, Hsin-Chu (TW)

(73) Assignee: HERMES-EPITEK CORP., Taipei (TW)

( * ) Notice: Subject to any disclaimer, the term of this patent is extended or adjusted under 35 U.S.C. 154(b) by 0 days. days.

(21) Appl. No.: 15/215,806

(22) Filed: Jul. 21, 2016

(65) Prior Publication Data
US 2016/0327591 A1 Nov. 10, 2016

Related U.S. Application Data

(62) Division of application No. 14/010,083, filed on Aug. 26, 2013, now Pat. No. 9,423,423.

(30) Foreign Application Priority Data

Sep. 28, 2012 (TW) .............. 101135866 A

(51) Int. Cl.
*G01R 31/00* (2006.01)
*G01R 1/073* (2006.01)
*G01R 31/28* (2006.01)

(52) U.S. Cl.
CPC ..... *G01R 1/07378* (2013.01); *G01R 1/07342* (2013.01); *G01R 31/2818* (2013.01)

(58) Field of Classification Search
CPC ............ G01R 1/07378; G01R 31/2889; G01R 31/2886; G01R 1/07314; G01R 31/2863;
(Continued)

(56) References Cited

U.S. PATENT DOCUMENTS

| 6,215,321 | B1 * | 4/2001 | Nakata | G01R 1/07378 324/756.03 |
| 6,459,039 | B1 * | 10/2002 | Bezama | H01L 23/49827 174/255 |
| 7,014,499 | B2 | 3/2006 | Yoon | |

(Continued)

FOREIGN PATENT DOCUMENTS

| JP | 2009192309 A | 8/2009 |
| JP | 2009293943 A | 12/2009 |

(Continued)

*Primary Examiner* — Vinh Nguyen
(74) *Attorney, Agent, or Firm* — Muncy, Geissler, Olds & Lowe, P.C.

(57) ABSTRACT

A probe card for circuit-testing with fine pitch circuit including a testing PCB, a probe head, and a silicon interposer substrate is provided. The probe head has a plurality of probes provided with a fine pitch arrangement and held inside. The silicon interposer substrate is used for conveying signals between said probes and said test PCB. The interconnection of said silicon interposer substrate is fully-filled formed by utilizing the through-silicon via semiconductor fabrication process. A plurality of upper terminals and a plurality of lower terminals are respectively array-arranged on the top surface and the bottom surface of said silicon interposer substrate. The pitch between the upper terminals is larger than the pitch between the lower terminals and the pitch between adjacent lower terminals is equal to the fine pitch of the arrangement of probes.

10 Claims, 7 Drawing Sheets

(58) Field of Classification Search
CPC ............ G01R 1/06711; G01R 1/07371; G01R 1/07307; G01R 1/06722; G01R 31/2884; G01R 1/0408; G01R 1/06772; G01R 1/0491; G01R 1/07342; G01R 1/06744; G01R 1/0735; G01R 1/06738; G01R 1/073; G01R 1/049; G01R 1/045; G01R 1/0483; G01R 31/026; G01R 31/2887; G01R 31/31717; G01R 31/31723; G01R 31/31905; G01R 31/31926; H05K 2201/10318; H05K 2201/068; H01R 12/718; H01R 13/24; H01R 13/2407; H01R 9/091; H01R 12/714; H01R 2201/20; H01R 12/526; H01R 13/2414; H01R 13/2428; H01R 9/096; H01R 12/52; H01R 12/7076; H01R 13/40
See application file for complete search history.

(56) References Cited

U.S. PATENT DOCUMENTS

| | | | | |
|---|---|---|---|---|
| 8,063,652 | B2* | 11/2011 | Amemiya | G01R 1/07371 324/754.11 |
| 9,423,423 | B2* | 8/2016 | Hung | G01R 1/07378 |
| 2002/0033707 | A1 | 3/2002 | Kohno et al. | |
| 2009/0283914 | A1* | 11/2009 | Murayama | H01L 21/486 257/773 |
| 2011/0089967 | A1 | 4/2011 | Kim | |

FOREIGN PATENT DOCUMENTS

| TW | 201038949 A1 | 11/2010 |
|---|---|---|
| TW | M421505 U1 | 1/2012 |
| TW | M423836 U1 | 3/2012 |
| TW | 201224463 A | 6/2012 |

\* cited by examiner

PROBE CARD FOR TESTING WAFERS WITH FINE PITCH CIRCUIT

CROSS-REFERENCE TO RELATED DOCUMENTS

The present invention is a division of application Ser. No. 14/010,083, filed Aug. 26, 2013 entitled, "probe card for circuit-testing", now, U.S. Pat. No. 9,423,423. All disclosures of which are incorporated herein in their entirety herein by reference.

BACKGROUND OF THE INVENTION

Field of the Invention

The present invention generally relates to a testing apparatus of integrated circuit, and more particularly to a probe card for circuit-testing.

Description of the Related Art

In the fabrication of the semiconductor product, integrated circuits of the wafer are tested to verify that they function appropriately and reliably. One method is to use automatic test equipment (ATE) to form a temporarily electrical connection between ATE and the integrated circuits of the wafer to verify the electrical characteristics of the integrated circuits. The probe card is used for transferring signals to the integrated circuits while testing.

Current probe card comprises a print circuit board (PCB), a substrate and a probe head. The probe head is provided with elastic probes thereon and the substrate is used to electrically connect probes and PCB. In generally, the substrate may be multi-layer organic (MLO) or multi-layer ceramic (MLC) interconnection substrate. Probes are electrically contacting via the die contact pad of the device of the wafer.

In general, in a probe card, the layout of the electrical contacts of the substrate serves as a function of transferring a fine pitch to a larger pitch. The fine pitch arrangement is usually in the probe head so as the PCB of the probe card can be made according to the larger pitch.

However, as semiconductor fabrication technology advances continue to be implemented, the pitch of the chips on the semiconductor wafer continues to shrink to the fine pitch. The demand of probe testing are faced with more challenges, such as ultra fine pitch, area array testing, high pin counts, high touchdown, and reducing cost. For instance, according to the manufacturing technology of the current MLO or MLC interconnection substrate, how to arrange more electrical contacts in a smaller space cannot match the shrink of the pitch. Hence, as the pitch is shrunk, the requirement of the technology and the cost is advanced.

SUMMARY OF THE INVENTION

In order to solve the above problem, one object of the present invention is directed to a probe card for circuit-testing provided with a silicon interposer substrate having the interconnection formed by the through-silicon via technology and capable of shrinking the pitch from the pitch range of the PCB to the fine pitch.

The present invention provides a probe card for circuit-testing comprising a testing PCB, a probe head, and a silicon interposer substrate is provided. The probe head has a plurality of probes provided with a fine pitch arrangement and held inside. The silicon interposer substrate is used for conveying signals between the probes and the test PCB. The interconnection of the silicon interposer substrate is fully-filled formed by utilizing the through-silicon via semiconductor fabrication process. A plurality of upper terminals and a plurality of lower terminals are respectively array-arranged on the top surface and the bottom surface of the silicon interposer substrate. The pitch between the upper terminals is larger than the pitch between the lower terminals and the pitch between adjacent lower terminals is equal to the fine pitch of the arrangement of probes. A sub print circuit board is arranged at the lower surface of said testing print circuit board for electrically connecting said silicon interposer substrate and said testing print circuit board, wherein the pitch of adjacent terminals of the upper surface of the sub print circuit board is equal to or larger than the pitch of corresponding terminals of the lower surface of the sub print circuit board.

DETAILED DESCRIPTION OF THE INVENTION

Reference will now be made in detail to specific embodiments of the present invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations are not described in detail in order not to obscure the present invention. Besides, the following embodiments of the present invention, the same or similar components illustrated in different embodiments refer to the same symbols.

Figure 1:
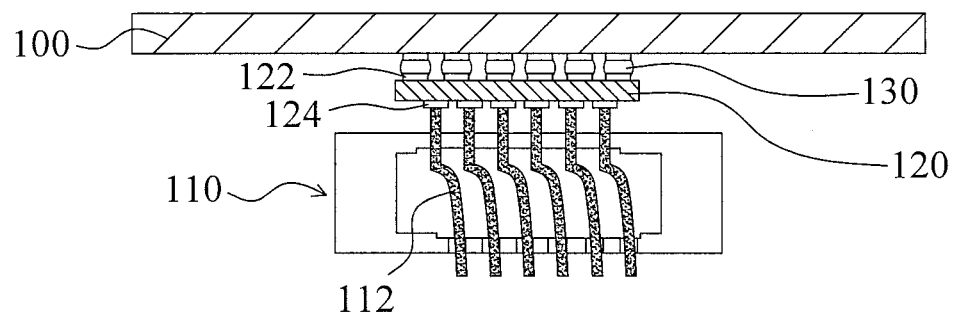
FIG. 1 illustrates a schematic diagram according to one embodiment of the present invention.

FIG. 1 illustrates a schematic diagram according to one embodiment of the present invention. Referring to FIG. 1, in the present invention, the probe card for circuit-testing is composed of a testing PCB 100, a probe head 110, and a silicon interposer substrate 120, wherein the probe head 110 is arranged at the bottom side of the test PCB 100 and the probe head 110 has a plurality of probes 112 arranged with a fine pitch and held inside. Probes 112 are used for electrically connecting to contact pads or terminals on the chip of the wafer for accessing the test. The silicon interposer substrate 120 is used for conveying signals between the probes 112 and the test PCB 100. It should be noted that the interconnection of the silicon interposer substrate 120 is formed by utilizing the through-silicon via (TSV) process so as the silicon interposer substrate 120 can match the probes 112 with the fine pitch arrangement.

Figure 2A:
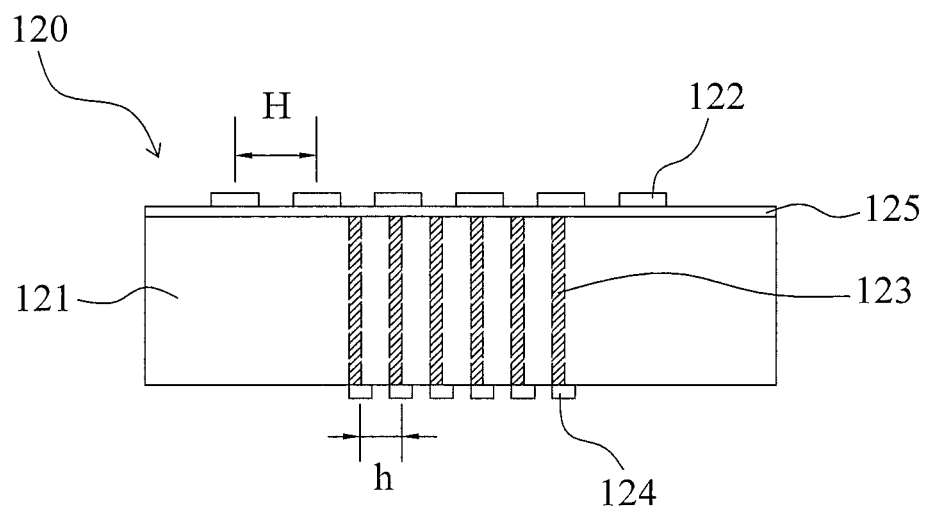
FIG. 2A, FIG. 2B, and FIG. 2C illustrate schematic diagrams according to different embodiments of the present invention.

In addition, simultaneously referring to FIG. 1 and FIG. 2A, a plurality of upper terminals 122 and a plurality of lower terminals 124 are respectively array-arranged on the top surface and the bottom surface of the silicon interposer substrate 120. The pitch H between the upper terminals 122 is larger than the pitch h between the lower terminals 124. Wherein, the pitch between adjacent lower terminals 124 is equal to the fine pitch arrangement of probes 112. Furthermore, in one embodiment, each pitch of the adjacent upper terminals 122 is larger than each pitch of the adjacent lower terminals 124.

Referring to FIG. 2A, in one embodiment, the silicon interposer substrate 120 is composed of a silicon substrate 121 and a redistribution layer (RDL) 125, wherein the silicon substrate 121 has a TSV conductive structure 123. The TSV conductive structure 123 is formed by the TSV process forming silicon through holes and then filling the conductive material inside to accomplish the TSV conductive structure 123. The RDL 125 is arranged on the upper surface of the silicon substrate 121, wherein the upper terminals 122 are arranged on the upper surface of the RDL 125. Upper terminals 122 are electrically connecting with the TSV conductive structure 123 via the RDL 125. In the present invention, upper terminals 122 and lower terminals 124 of the silicon interposer substrate 120 may be a conductive solder pad, such as the metal solder pad. In addition, upper terminals 122 and lower terminals 124 are electrically connecting with each other by the RDL 125 and the TSV conductive structure 123.

Figure 2B:
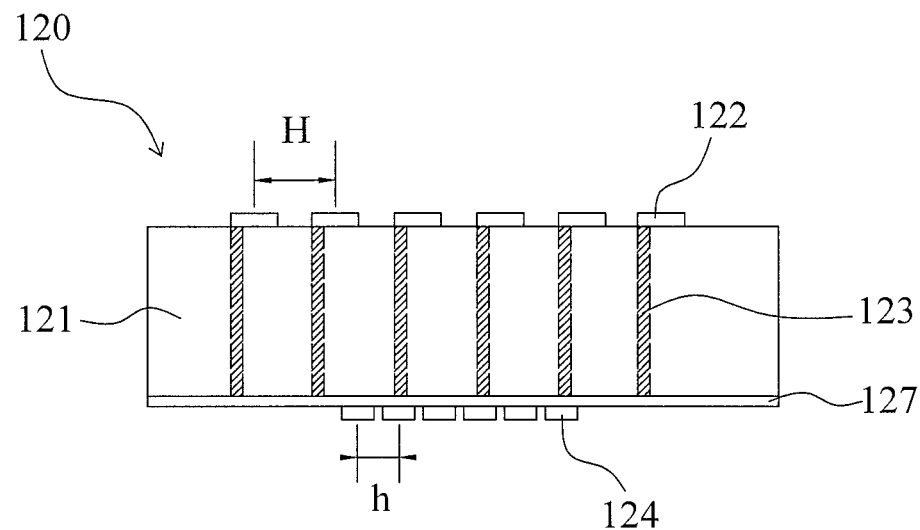
Figure 2C:
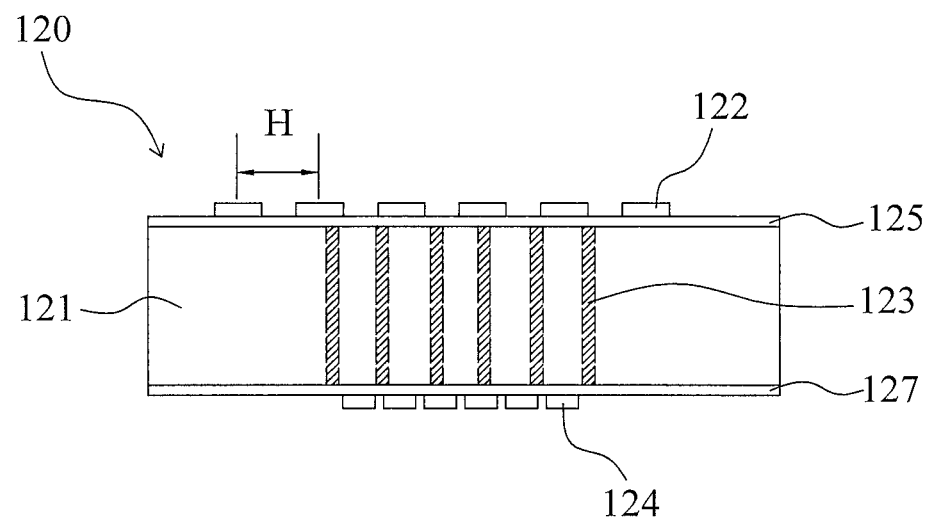

Next, such as shown in FIG. 2B, in one embodiment, the silicon interposer substrate 120 is composed of a silicon substrate 121 and a redistribution layer 127 (RDL), wherein the RDL 127 is arranged on the lower surface of the silicon substrate 121, wherein the lower terminals 124 are arranged on the lower surface of the RDL 127. Lower terminals 124 are electrically connecting with the TSV conductive structure 123 via the RDL 127. In the present invention, it should be understood that depends on the requirement, such as shown in FIG. 2C, the RDL 125 and the RDL 127 can be respectively arranged on the upper surface and the lower surface of the silicon substrate 121. In addition, upper terminals 122 and lower terminals 124 are electrically connecting with the TSV conductive structure 123 via the RDL 125 and the RDL 127.

Figure 3:
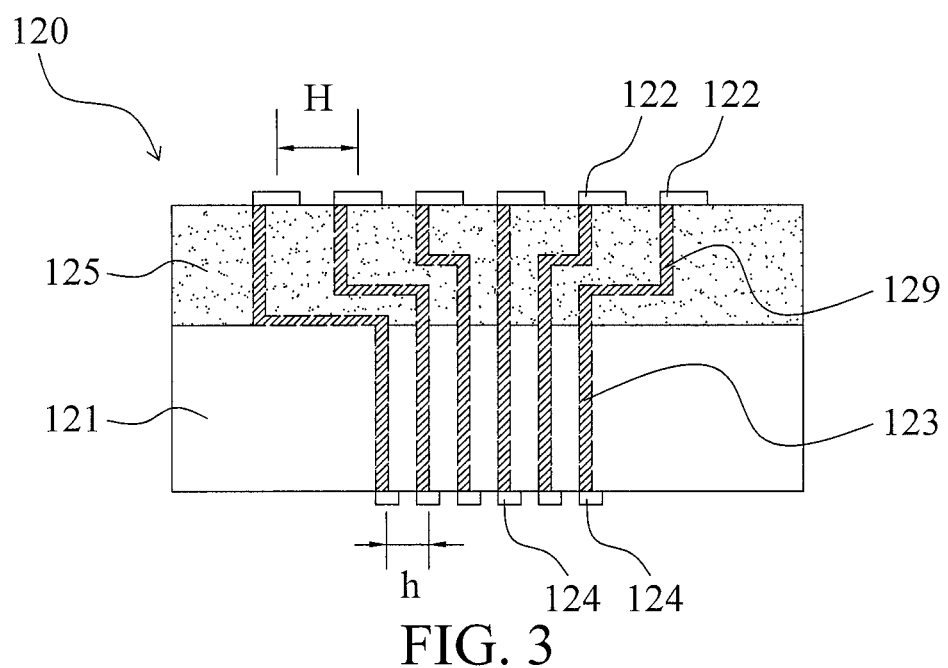
FIG. 3 illustrates a schematic diagram according to one embodiment of the present invention.

In detail, such as shown in FIG. 3, the TSV conductive structure 123 is formed by forming the silicon through via in the silicon substrate, such as the silicon wafer, and filing the conductive material inside. It should be noted that filling the material inside the silicon through via is not limited by the filling process, but can be accomplished by kinds of semiconductor processes, such as metal chemical vapor deposition, electroplate, polish and etc. After the above processes, the RDL 125 is formed on the upper surface of the silicon substrate 121. Semiconductor processes, such as the deposition, photolithography, etching and etc, are utilized to form the RDL 125 and the conductive circuit 129 therein. In the present invention, three-dimensional integrated circuit technology of semiconductor process is utilized to accomplish the suitable interconnection structure of the silicon interposer substrate 120. It will be understood by those of skill in the art that the manufacturing method and the working steps of the interconnection, the RDL and the terminals comprise kinds of semiconductor process technology, the detail description and the options is omitted the illustration herein.

Figure 4A:
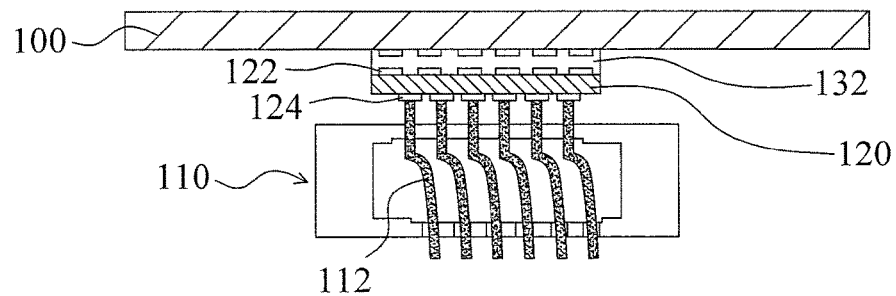
FIG. 4A and FIG. 4B illustrate schematic diagrams according to different embodiments of the present invention.

In one embodiment, such as shown in FIG. 1, a plurality of solder balls 130 (or bumps) are arranged on the upper terminals 122 of the silicon interposer substrate 120 for electrically connecting the silicon interposer substrate 120 and the test PCB 100. Further, in another embodiment, such as shown in FIG. 4A, an anisotropic conductive film 132 (ACF) also can be used for electrically connecting the silicon interposer substrate 120 and the test PCB 100.

Figure 4B:
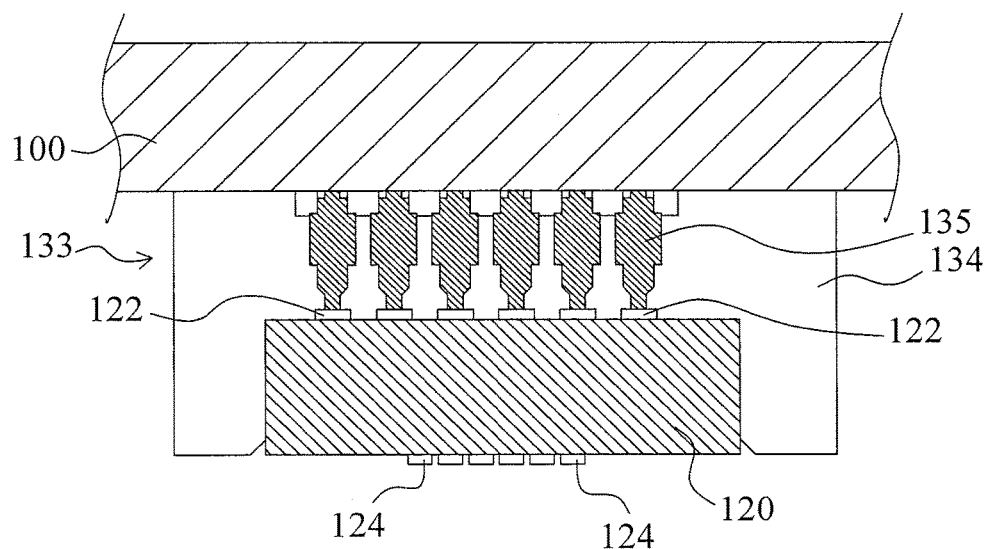

Next, referring to FIG. 4B, in one embodiment, a pogo-pin connector 133 is used for electrically connecting the test PCB 100 and the silicon interposer substrate 120. The pogo-pin connector 133 is a socket-type connector which is composed of a housing 134 and a plurality of pogo-pins 135. The silicon interposer substrate 120 is inserted into a socket structure of the housing 134 of the pogo-pin connector 133 and then electrically connecting with the test PCB 100 via contacting the pogo-pins 135.

Figure 5A:
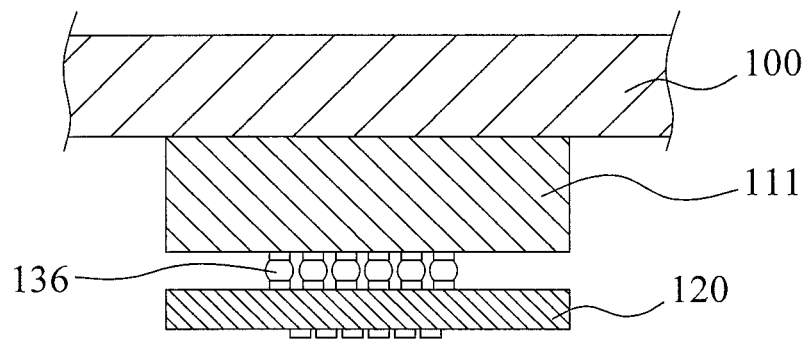
FIG. 5A and FIG. 5B illustrate schematic diagrams according to different embodiments of the present invention.
Figure 5B:
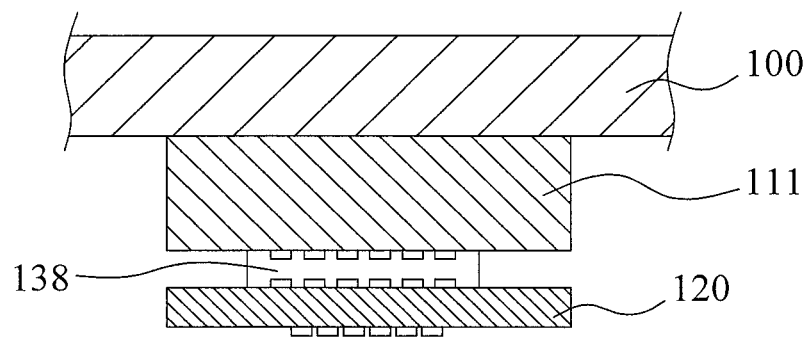

In one embodiment, the electrical connection way between the teat PCB 100 and the silicon interposer substrate 120 may be further arranged a sub-PCB 111, such as shown in FIG. 5A. Besides, solder balls 136 or bumps may be arranged on the upper surface of the silicon interposer substrate 120 for electrically connecting the sub-PCB 111 and the silicon interposer substrate 120. Further, in one embodiment, an anisotropic conductive film 138 may also be used for electrically connecting the sub-PCB 111 and the silicon interposer substrate 120, such as shown in FIG. 5B.

Figure 6A:
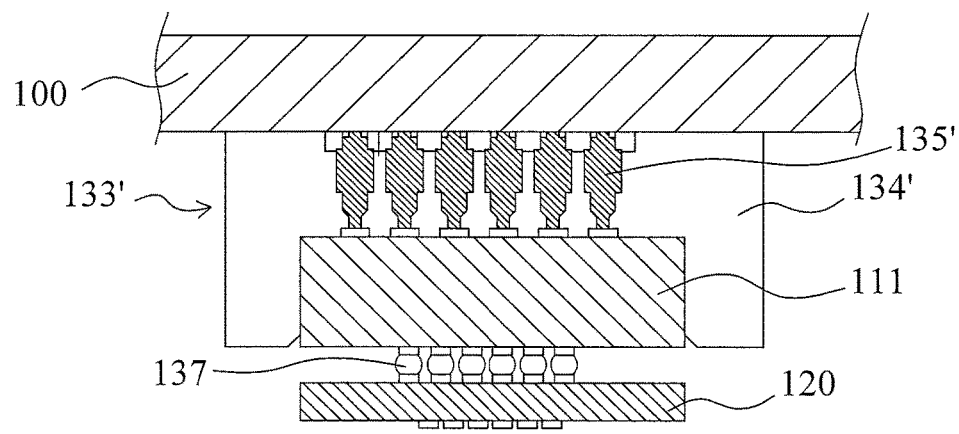
FIG. 6A and FIG. 6B illustrate schematic diagrams according to different embodiments of the present invention.
Figure 6B:
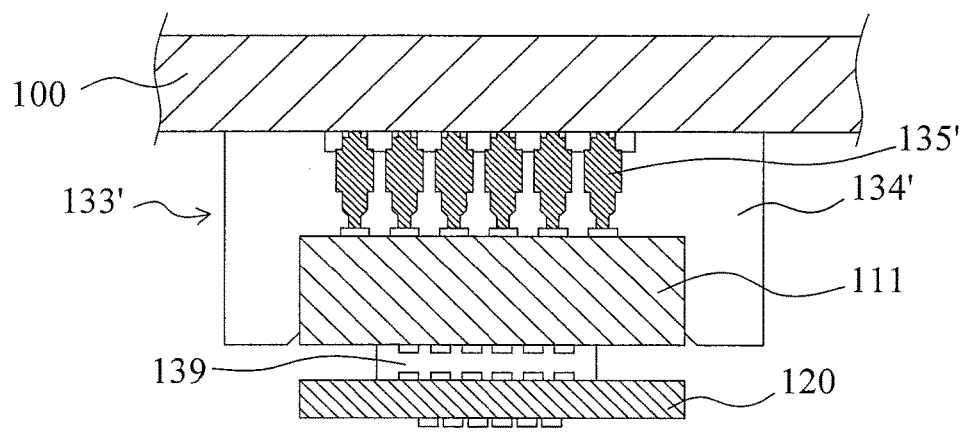

Next, referring to FIG. 6A and FIG. 6B, in one embodiment, a pogo-pin connector 133' is used for electrically connecting the test PCB 100 and the sub-PCB 111. The pogo-pin connector 133' is a socket-type connector which is composed of a housing 134' and a plurality of pogo-pins 135'. The sub-PCB 111 is inserted into a socket structure of the housing 134' of the pogo-pin connector 133' and then electrically connecting with the test PCB 100 via contacting the pogo-pins 135'. Further, the electrical connection between the sub-PCB 111 and the silicon interposer substrate 120 may utilize solder balls 137, bumps or an anisotropic conductive film 139 to electrically connect to each other, such as shown in FIG. 6A and FIG. 6B.

In the present invention, it should be noted that the sub-PCB is alternatively used according to the requirement. Referring to FIG. 6A and FIG. 6B, the pitch of adjacent terminals of the upper surface of the sub-PCB 111 is larger than the pitch of corresponding terminals of the lower surface of the sub-PCB 111. Besides, it can be understood that the pitch of adjacent terminals of the upper surface of the sub-PCB 111 may be equal to the pitch of corresponding terminals of the lower surface of the sub-PCB 111 if necessary. Hence, as the original specification of the test PCB 100 cannot match to the terminals at the junction surface of the silicon inter substrate 120 or cannot qualify other request, the sub-PCB 111 may be used as an interface between the test PCB 100 and the silicon inter substrate 120. Moreover, when the original specification of the pogo-pin connector (133 and 133') cannot match to the silicon interposer substrate 120, the sub-PCB 111 can be selected for the interface between the pogo-pin connector (133 and 133') and the silicon interposer substrate 120.

In the present invention, the silicon interposer is used for conveying the signal between probes and the test PCB. As the pitch of the testing points of chips on the wafer is continually shrinking to the fine pitch, the pitch arrangement of probes should be simultaneously shrinking. However, the pitch of the contact pads of the MLO or MLC substrate has been limited by the manufacturing technology. The present invention utilizes the silicon interposer substrate formed by the TSV process so as it can match and support the trend of the shrinking pitch.

Figure 7:
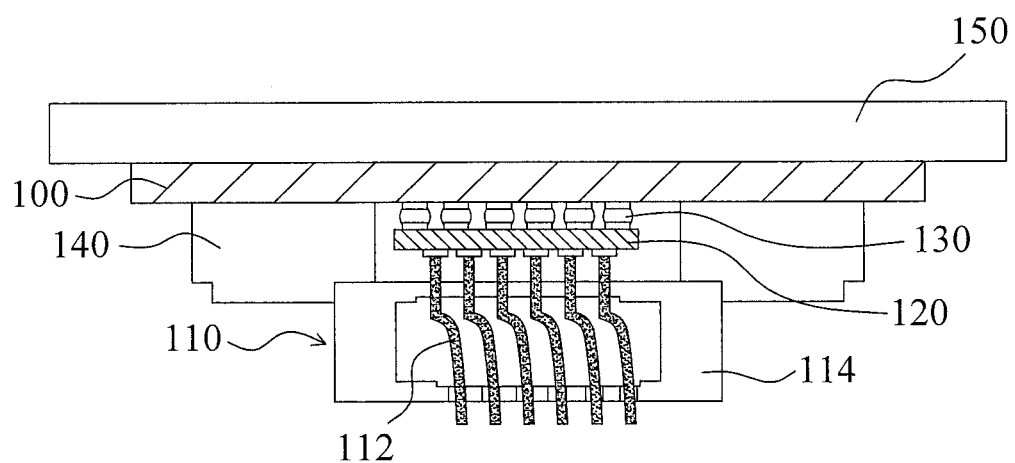
FIG. 7 illustrates a schematic diagram according to one embodiment of the present invention.

Referring to FIG. 7, in one embodiment of the probe card, a fixing ring 140 is arranged for fixing the probe head 110 on the bottom side of the test PCB 100. In one embodiment, a reinforcing pad 150 is arranged to prevent the test PCB 100 from being distorted by external force or high temperature. In one embodiment, the probe head 110 further comprises a probe holder 114 for holding probes 112.

In the present invention, the silicon interposer substrate is formed by the semiconductor technology, so as the silicon interposer substrate is mainly made of silicon or other material of semiconductor wafer. The sub-PCB is made of ceramic material or other PCB material, such as FR-4, FR-5 or BP.

To sum up the foregoing, a probe card for circuit-testing of the present invention is provided with a silicon interposer substrate having the interconnection formed by the through-silicon via technology and capable of shrinking the pitch from the pitch range of the PCB to the fine pitch. As the pitch of the testing points of chips or tested device is continually shrinking, the silicon interposer substrate of the present invention can effectively match the shrinking problem so as the probe card can be applied to the shrinking pitch of the testing points.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A probe card for circuit-testing comprising:
   a testing print circuit board;
   a probe head having a plurality of probes provided with a fine pitch arrangement and held inside;
   a silicon interposer substrate for conveying signals between said probes and said test PCB, wherein the interconnection of said silicon interposer substrate is fully-filled formed by utilizing the through-silicon via semiconductor fabrication process; a plurality of upper terminals and a plurality of lower terminals are respectively array-arranged on the top surface and the bottom surface of said silicon interposer substrate; the pitch between said upper terminals is larger than the pitch between said lower terminals; and the pitch between adjacent lower terminals is equal to the fine pitch of the arrangement of probes; and wherein said silicon interposer substrate comprises: a silicon substrate with a TSV conductive structure; and a redistribution layer arranged on at least one of the upper surface of said silicon substrate or the lower surface of said silicon substrate, wherein said upper terminals are arranged on the upper surface of said redistribution layer; and
   a sub print circuit board arranged at the lower surface of said testing print circuit board for electrically connecting said silicon interposer substrate and said testing print circuit board, wherein the pitch of adjacent terminals of the upper surface of the sub print circuit board is equal to or larger than the pitch of corresponding terminals of the lower surface of the sub print circuit board.

2. The probe card for circuit-testing as claimed in claim 1, further comprising a plurality of solder balls or bumps arranged on the surface of said silicon interposer substrate for electrically connecting to said testing print circuit board.

3. The probe card for circuit-testing as claimed in claim 1, further comprising an anisotropic conductive film (ACF) for electrically connecting said testing print circuit board and said silicon interposer substrate.

4. The probe card for circuit-testing as claimed in claim 1, further comprising a pogo-pin connector for electrically connecting said testing print circuit board and said silicon interposer substrate, wherein said silicon interposer substrate is inserted into said pogo-pin connector.

5. The probe card for circuit-testing as claimed in claim 1, further comprising a plurality of solder balls or bumps arranged on the surface of said silicon interposer substrate for electrically connecting to said sub print circuit board.

6. The probe card for circuit-testing as claimed in claim 1, further comprising an anisotropic conductive film (ACF) for electrically connecting said silicon interposer substrate and said sub print circuit board.

7. The probe card for circuit-testing as claimed in claim 1, wherein each pitch of said adjacent upper terminals is larger than each pitch of said adjacent lower terminals.

8. The probe card for circuit-testing as claimed in claim 1, further comprising a fixing ring used for fixing said probe head on the bottom of said testing print circuit board.

9. The probe card for circuit-testing as claimed in claim 1, further comprising a reinforcing pad to prevent said testing print circuit board from being distorted by external force or high temperature.

10. The probe card for circuit-testing as claimed in claim 1, wherein said probe head further comprises a probe holder for holding said probes.

* * * * *